(12) United States Patent
Pani

(10) Patent No.: US 7,788,445 B2
(45) Date of Patent: Aug. 31, 2010

(54) INTELLIGENT ALLOCATION OF PROGRAMMABLE COMPARISON OPERATIONS FOR REDUCING THE NUMBER OF ASSOCIATIVE MEMORY ENTRIES REQUIRED

(75) Inventor: Ayaskanta Pani, Fremont, CA (US)

(73) Assignee: Cisco Technology, Inc, San Jose, CA (US)

( * ) Notice: Subject to any disclaimer, the term of this patent is extended or adjusted under 35 U.S.C. 154(b) by 825 days.

(21) Appl. No.: 11/729,367

(22) Filed: Mar. 28, 2007

(65) Prior Publication Data

US 2008/0244170 A1    Oct. 2, 2008

(51) Int. Cl.
G06F 12/00    (2006.01)
(52) U.S. Cl. .............. 711/108; 711/156; 711/E12.001
(58) Field of Classification Search ................. None
See application file for complete search history.

(56) References Cited

U.S. PATENT DOCUMENTS

| | | | |
|---|---|---|---|
| 6,377,577 B1 | 4/2002 | Bechtolsheim et al. |
| 6,606,681 B1 | 8/2003 | Uzun |
| 6,658,002 B1 | 12/2003 | Ross et al. |
| 6,715,029 B1 | 3/2004 | Trainin et al. |
| 6,717,946 B1 | 4/2004 | Hariguchi et al. |
| 6,775,737 B1 | 8/2004 | Warkhede et al. |
| 7,080,195 B2 | 7/2006 | Ngai et al. |
| 7,177,978 B2 | 2/2007 | Kanekar et al. |
| 7,249,228 B1 | 7/2007 | Agarwal et al. |
| 7,313,667 B1 | 12/2007 | Pullela et al. |
| 7,350,020 B2 | 3/2008 | Kanekar et al. |
| 7,403,526 B1 | 7/2008 | Zou et al. |

*Primary Examiner*—Reginald G Bragdon
*Assistant Examiner*—Eric Loonan
(74) *Attorney, Agent, or Firm*—The Law Office of Kirk D. Williams

(57) ABSTRACT

Intelligent allocation of programmable comparison operations may reduce the number of associative memory entries required for programming an associative memory (e.g., ternary content-addressable memory) with multiple matching definitions (e.g., access control list entries, routing information, etc.), which may be particularly useful in identifying packet processing operations to be performed on packets in a packet switching device. The higher-cost comparison operations, in terms of the number of associative memory entries required to natively support such operations, are allocated to one or more comparison evaluators (e.g., programmable logic and/or processing elements configured to evaluate one or more comparison operations) configured to evaluate an input value with one or more of the programmable comparison operations in order to generate and provide one or more values representing results of the evaluations to one or more associative memories for use in identifying the packet processing operations.

20 Claims, 4 Drawing Sheets

```
WHILE THERE ARE COMPARISON OPERATION PAIRS (CO-PAIRS) AND CO'S LEFT IN THE LIST
    PICK UP THE HIGHEST COST CO-PAIR (CO_P) AND THE ASSOCIATED CO'S OF IT
    (LETS CALL THESE CO_P_1, CO_P_2, WHERE CO_P_1'S COST IS > CO_P_2'S COST).
    PICK UP THE TOP TWO CO'S - LETS CALL THESE CO_S_1, CO_S_2. (SINGLE CO).
    IF ALL COSTS ARE 0 THEN BREAK OUT OF THE LOOP.
    IF THE COST OF (CO_S_1 + CO_S_2) < COST OF THE CO_P THEN
        FIRST_TRY = CO_P_1
        SECOND_TRY = CO_P_2
        MAKE THE COST OF THE CO_PAIR = 0
            SO THAT THIS PAIR FALLS OUT OF CONTENTION IN FUTURE.
    ELSE
        FIRST_TRY = CO_S_1
        SECOND_TRY = CO_S_2
    ENDIF
    TRY TO ALLOCATE FIRST_TRY IN A PROGRAMMABLE COMPARISON OPERATION.
    MAKE THE COST OF THE FIRST_TRY CO AS 0. (SO THAT IT FALLS OUT OF CONTENTION IN FUTURE.)
    IF FIRST_TRY FAILED THEN
        TRY TO ALLOCATE THE SECOND_TRY IN A PROGRAMMABLE COMPARISON OPERATION.
        MAKE THE COST OF THE SECOND_TRY AS 0.
    END_IF
    IF THERE IS NO PROGRAMMABLE COMPARISON OPERATION LEFT BREAK OUT OF THE WHILE LOOP.
END-WHILE
```

INTELLIGENT ALLOCATION OF PROGRAMMABLE COMPARISON OPERATIONS FOR REDUCING THE NUMBER OF ASSOCIATIVE MEMORY ENTRIES REQUIRED

TECHNICAL FIELD

The present disclosure relates generally to communications and computer systems, especially packet switching systems, and other networked devices.

BACKGROUND

The communications industry is rapidly changing to adjust to emerging technologies and ever increasing customer demand. This customer demand for new applications and increased performance of existing applications is driving communications network and system providers to employ networks and systems having greater speed and capacity (e.g., greater bandwidth). In trying to achieve these goals, a common approach taken by many communications providers is to use packet switching technology. Increasingly, public and private communications networks are being built and expanded using various packet technologies, such as Internet Protocol (IP). Note, nothing described or referenced in this document is admitted as prior art to this application unless explicitly so stated.

Associative memories, especially ternary content-addressable memories (TCAMs), are currently used in packet switching devices in the processing of packets, including routing (e.g., finding a longest matching prefix) and access control (e.g., finding entries matching access control list (ACL) entries). Representing a prefix (or a fully specified value) in an TCAM requires a single entry, but representing a range of values (e.g., port 50-80) or other operations (e.g., less than 50, not equal to 10) can require a large number of TCAM entries.

BRIEF DESCRIPTION OF THE DRAWINGS

The appended claims set forth the features of the invention with particularity. The invention, together with its advantages, may be best understood from the following detailed description taken in conjunction with the accompanying drawings of which:

FIG. 4 is a block diagram of a process used in one embodiment

DESCRIPTION OF EXAMPLE EMBODIMENTS

1. Overview

Figure 1:
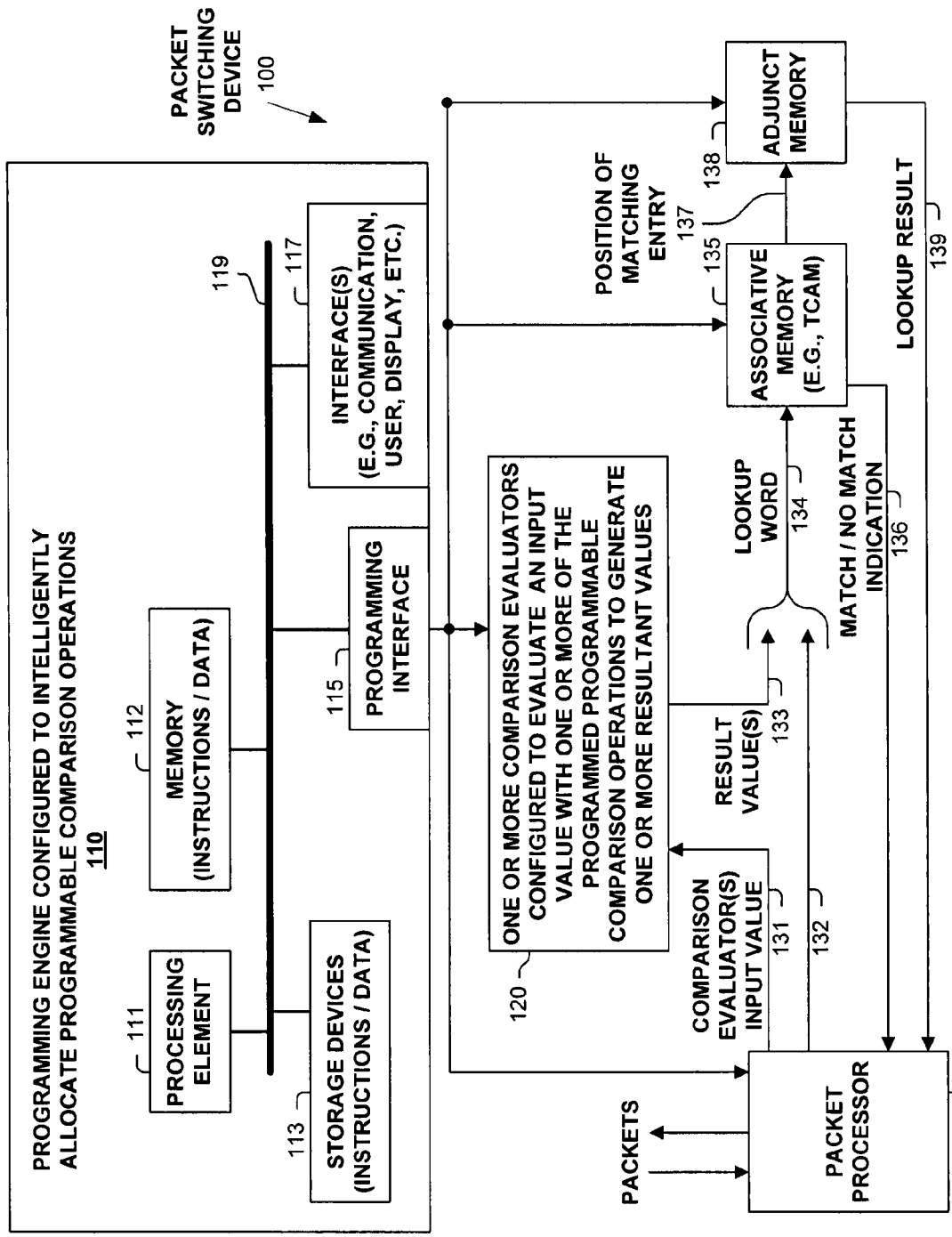
FIG. 1 illustrates is a block diagram of one embodiment.

Disclosed are, inter alia, methods, apparatus, computer-readable media, mechanisms, and means for the intelligent allocation of programmable comparison operations for reducing the number of associative memory entries required.

One embodiment allocates multiple programmable comparison operations for use in packet processing operations in a packet switching device based on multiple matching definitions (e.g., access control list entries, routing information, etc.). The packet switching device includes one or more comparison evaluators (e.g., programmable logic and/or processing elements configured to evaluate one or more comparison operations) configured to evaluate an input value with one or more of the programmable comparison operations based on their programming in order to generate and provide one or more values representing results of the evaluations to one or more associative memories for use in identifying the packet processing operations. One embodiment determines a cost reflective of a number of associative memory entries required to represent each particular comparison operation identified from the matching definitions; processes the determined costs of the comparison operations in order to identify the higher-cost comparison operations; and programs the identified higher-cost comparison operations into programmable comparison operations of the comparison evaluators.

2. Description

Disclosed are, inter alia, methods, apparatus, computer-readable media, mechanisms, and means for the intelligent allocation of programmable comparison operations for reducing the number of associative memory entries required.

Note, embodiments described herein include various elements and limitations, with no one element or limitation contemplated as being a critical element or limitation. Each of the claims individually recites an aspect of the invention in its entirety. Moreover, some embodiments described may include, but are not limited to, inter alia, systems, networks, integrated circuit chips, embedded processors, ASICs, methods, and computer-readable media containing instructions. One or multiple systems, devices, components, etc. may comprise one or more embodiments, which may include some elements or limitations of a claim being performed by the same or different systems, devices, components, etc. The embodiments described hereinafter embody various aspects and configurations within the scope and spirit of the invention, with the figures illustrating exemplary and non-limiting configurations. Note, computer-readable media and means for performing methods and processing block operations are disclosed and are in keeping with the extensible scope and spirit of the invention.

As used herein, the term "packet" refers to packets of all types or any other units of information or data, including, but not limited to, fixed length cells and variable length packets, each of which may or may not be divisible into smaller packets or cells. The term "packet" as used herein also refers to both the packet itself or a packet indication, such as, but not limited to all or part of a packet or packet header, a data structure value, pointer or index, or any other part or direct or indirect identification of a packet or information associated therewith. For example, often times a router operates on one or more fields or data of a packet, especially the header, so the body of the packet is often stored in a separate memory while the packet header is manipulated, and based on the results of the processing of the packet (i.e., the packet header in this example), the entire packet is forwarded or dropped, etc. Additionally, these packets may contain one or more types of information, including, but not limited to, voice, data, video, and audio information. The term "item" is used generically herein to refer to a packet or any other unit or piece of information or data, a device, component, element, or any other entity. The phrases "processing a packet" and "packet processing" typically refer to performing some steps or actions based on the packet contents (e.g., packet header or other fields), and such steps or action may or may not include modifying, storing, dropping, and/or forwarding the packet and/or associated data. The term or reference to "dropping" a packet or a variant thereof (e.g., drop the packet, the packet is dropped, etc.) is used herein to identify the physical dropping of the packet, causing the packet to be dropped, and/or marking or distinguishing the packet for subsequent dropping or potentially different processing (e.g., a higher probability of being dropped by subsequent processing, Early Congestion Notification marking, etc.) than that of an "admitted" packet. The term "interface" of a networked device refers to a physical interface, a logical interface (e.g., a portion of a physical interface or sometimes referred to in industry as a sub-interface—for example, such as, but not limited to a particular VLAN associated with a network interface), and/or a virtual interface (e.g., traffic grouped together based on some characteristic—for example, such as, but not limited to, a tunnel interface).

The term "system" is used generically herein to describe any number of components, elements, sub-systems, devices, packet switch elements, packet switches, routers, networks, computer and/or communication devices or mechanisms, or combinations of components thereof. The term "computer" is used generically herein to describe any number of computers, including, but not limited to personal computers, embedded processing elements and systems, control logic, ASICs, chips, workstations, mainframes, etc. The term "processing element" is used generically herein to describe any type of processing mechanism or device, such as a processor, ASIC, field programmable gate array, computer, etc. The term "device" is used generically herein to describe any type of mechanism, including a computer or system or component thereof. The terms "task" and "process" are used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating system address spaces, a routine of a library and/or standalone application, and is not limited to any particular memory partitioning technique. The steps, connections, and processing of signals and information illustrated in the figures, including, but not limited to any block and flow diagrams and message sequence charts, may typically be performed in the same or in a different serial or parallel ordering and/or by different components and/or processes, threads, etc., and/or over different connections and be combined with other functions in other embodiments, unless this disables the embodiment or a sequence is explicitly or implicitly required (e.g., for a sequence of read the value, process the value—the value must be obtained prior to processing it, although some of the associated processing may be performed prior to, concurrently with, and/or after the read operation). Furthermore, the term "identify" is used generically to describe any manner or mechanism for directly or indirectly ascertaining something, which may include, but is not limited to receiving, retrieving from memory, determining, defining, calculating, generating, etc.

Moreover, the terms "network" and "communications mechanism" are used generically herein to describe one or more networks, communications media or communications systems, including, but not limited to the Internet, private or public telephone, cellular, wireless, satellite, cable, local area, metropolitan area and/or wide area networks, a cable, electrical connection, bus, etc., and internal communications mechanisms such as message passing, interprocess communications, shared memory, etc. The term "message" is used generically herein to describe a piece of information which may or may not be, but is typically communicated via one or more communication mechanisms of any type.

The term "storage mechanism" includes any type of memory, storage device or other mechanism for maintaining instructions or data in any format. "Computer-readable medium" is an extensible term including any memory, storage device, and/or other storage mechanism. The term "memory" includes any random access memory (RAM), read only memory (ROM), flash memory, integrated circuits, and/or other memory components or elements. The term "storage device" includes any solid state storage media, disk drives, diskettes, networked services, tape drives, and other storage devices. Memories and storage devices may store computer-executable instructions to be executed by a processing element and/or control logic, and data which is manipulated by a processing element and/or control logic. The term "data structure" is an extensible term referring to any data element, variable, data structure, database, and/or one or more organizational schemes that can be applied to data to facilitate interpreting the data or performing operations on it, such as, but not limited to memory locations or devices, sets, queues, trees, heaps, lists, linked lists, arrays, tables, pointers, etc. A data structure is typically maintained in a storage mechanism. The terms "pointer" and "link" are used generically herein to identify some mechanism for referencing or identifying another element, component, or other entity, and these may include, but are not limited to a reference to a memory or other storage mechanism or location therein, an index in a data structure, a value, etc.

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations.

In addition, the terms "first," "second," etc. are typically used herein to denote different units (e.g., a first element, a second element). The use of these terms herein does not necessarily connote an ordering such as one unit or event occurring or coming before another, but rather provides a mechanism to distinguish between particular units. Additionally, the use of a singular tense of a noun is non-limiting, with its use typically including one or more of the particular thing rather than just one (e.g., the use of the word "memory" typically refers to one or more memories without having to specify "memory or memories," or "one or more memories" or "at least one memory", etc.). Moreover, the phrases "based on x" and "in response to x" are used to indicate a minimum set of items "x" from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modifying or not modifying the coupled signal or communicated information. Moreover, the term "or" is used herein to identify a selection of one or more, including all, of the conjunctive items. Additionally, the transitional term "comprising," which is synonymous with "including," "containing," or "characterized by," is inclusive or open-ended and does not exclude additional, unrecited elements or method steps.

Disclosed are, inter alia, methods, apparatus, computer-readable media, mechanisms, and means for the intelligent allocation of programmable comparison operations for reducing the number of associative memory entries required.

One embodiment allocates multiple programmable comparison operations for use in packet processing operations in a packet switching device based on multiple matching definitions (e.g., access control list entries, routing information, etc.). The packet switching device includes one or more comparison evaluators (e.g., programmable logic and/or processing elements configured to evaluate one or more programmable comparison operations) configured to evaluate an input value with one or more of the programmable comparison operations in order to generate and provide one or more values representing results of the evaluations to one or more associative memories for use in identifying the packet processing operations.

For example, different operations (e.g., ranges of values, logical operations of values, etc.) specified in an access control list entry may require many entries in an associative memory (e.g., TCAM). Bechtolsheim et al., U.S. Pat. No. 6,377,577 (hereby incorporated by reference in its entirety) describes (for example in its Abstract) preprocessing circuits that are used for evaluating a port number against know special cases such as "greater than 1023" or "within the range of 6000 to 6500." The comparison evaluators with their programmable comparison operations referenced herein may include, for example, Bechtolsheim et al.'s preprocessing circuitry, comparison evaluators configured to evaluate a single programmed comparison operation (e.g., range operation, greater than, greater than or equal to, less than, less than or equal to, equal to, and not equal to, etc.), or comparison evaluators configured to evaluate multiple programmed comparison operations (e.g., a processing element and/or logic programmed to evaluate multiple comparison operations). These comparison evaluators with their programmable comparison operations are typically expensive resources and limited in number. Previous systems have use a first-come, first-served approach in allocating these preprocessing circuits.

This disclosure expands on the teaching of such previous systems and teaches that an intelligent allocation of programmable comparison operations can reduce the number of associative memory (e.g., TCAM) entries required, when there are not enough programmable comparison operations in the comparison evaluators available to evaluate all desired comparison operations (e.g., when the plurality of comparison operations has more comparison operations than the number of programmable comparison operations).

In evaluating which comparison operations to program into the programmable comparison operations of the comparison evaluators, one embodiment evaluates the various comparison operations required in terms of the associative memory entries required, such as in terms of individual comparison operations and multiple comparison operations required by a single entry in the matching definitions. For example, an ACL entry may specify both source port ranges and destination port ranges, and then the number of associative memory entries required is the product of the number of associative memory entries required for each individual range.

Therefore, one embodiment determines a cost reflective of a number of associative memory entries required to represent each particular comparison operation identified from the matching definitions; processes the determined costs of the comparison operations in order to identify multiple higher-cost comparison operations; and programs the identified higher-cost comparison operations into the programmable comparison operations of the comparison evaluators.

In one embodiment, processing the determined costs includes evaluating the determined costs of individual comparison operations and the combined cost of multiple comparison operations identified in single entries of the matching definitions.

In one embodiment, evaluating the determined costs of individual comparison operations and the combined cost of multiple comparison operations identified in single entries of the matching definitions includes: identifying, from the comparison operations not already identified as one of the higher-cost comparison operations, multiple individual comparison operations having the highest one or more costs and the highest cost set of the multiple comparison operations identified in a single entry of the matching definitions, and identifying as one of the identified higher-cost comparison operations a selected comparison operation of the individual comparison operations in response to determining that the sum of the costs of the individual comparison operations is greater than the cost of the highest cost set of the multiple comparison operations. In one embodiment, the cost of the selected comparison operations is at least the cost of the other one or more comparison operations in the individual comparison operations.

In one embodiment, evaluating the determined costs of individual comparison operations and the combined cost of multiple comparison operations identified in single entries of the matching definitions includes: identifying, from the comparison operations not already identified as one of the plurality of higher-cost comparison operations, multiple individual comparison operations having the highest one or more costs and the highest cost set of the multiple comparison operations identified in a single entry of the matching definitions, and identifying as one of the identified higher-cost comparison operations a selected comparison operation of the multiple comparison operations identified in a single entry of the matching definitions in response to determining that the cost of the highest cost set of the multiple comparison operations is greater than the sum of the costs of the individual comparison operations. In one embodiment, the cost of the selected comparison operations is at least the cost of the other one or more comparison operations in the comparison operations identified in a single entry of the plurality of matching definitions.

In one embodiment, evaluating the determined costs of individual comparison operations and the combined cost of multiple comparison operations identified in single entries of the matching definitions includes: repeating multiple times, in order to identify the identified higher-cost comparison operations, the operations of: identifying two individual comparison operations having the highest one or more costs and the highest cost pair of comparison operations identified in a single entry of the matching definitions, and identifying as one of the identified higher-cost comparison operations one comparison operation from the group comprising the two individual comparison operations and the pair of comparison operations based a comparison of the sum of the costs of said two individual comparison operations and the product of the costs of said comparison operations in the pair of comparison operations. In one embodiment, the operation of identifying as one of the identified higher-cost comparison operations one comparison operation from the group comprising said two individual comparison operations and said pair of comparison operations is further based on the relative costs of said individual comparison operations or the relative costs of said comparison operations in the pair of comparison operations.

In one embodiment, the number of comparison operations is greater than the number of comparison evaluators. In one embodiment, the matching definitions are defined from an access control list. In one embodiment, matching definitions are defined from routing addresses. In one embodiment, the one or more associative memories includes at least one ternary content-addressable memory (TCAM). In one embodiment, the comparison operations include at least one range operation. In one embodiment, the comparison operations includes at least one logical operation from a group of logical operations comprising greater than, greater than or equal to, less than, less than or equal to, equal to, and not equal to.

One embodiment includes an apparatus comprising one or more processors and a memory, wherein the memory stores one or more instructions that, when executed by said one or more processors, perform operations for allocating a plurality of programmable comparison operations based on a plurality of matching definitions.

One embodiment includes an apparatus for allocating a plurality of programmable comparison operations based on a plurality of matching definitions. One embodiment of such an apparatus includes: means for determining a cost reflective of a number of associative memory entries required to represent each particular comparison operation of a plurality of comparison operations identified from the plurality of matching definitions; and means for processing said determined costs of said plurality of comparison operations in order to identify a plurality of higher-cost comparison operations of the plurality of comparison operations. In one embodiment, the apparatus includes: means for performing said programmed comparison operations, means for programming said means for performing said programmed comparison operation, and one or more associative memories; wherein said means for performing said programmed comparison operation are configured to evaluate an input value with one or more of the plurality of programmable comparison operations in order to generate and provide one or more values representing results of said evaluations to said one or more associative memories. In one embodiment, said means for said processing the determined costs includes means for evaluating said determined costs of individual comparison operations of the plurality of comparison operations and the combined cost of a plurality of comparison operations identified in single entries of the plurality of matching definitions.

Turning expressly to the figures, FIG. 1 illustrates a block diagram of one embodiment including a packet switching device 100, including programming engine 110 configured to intelligently allocate the programmable comparison operations in one or more comparison evaluators 120.

In one embodiment, system or component 110 performs one or more processes corresponding to one of the flow diagrams illustrated or otherwise described herein.

In one embodiment, system or component 110 includes a processing element 111, memory 112, storage devices 113, a programming interface 115, and interface(s) 117, which are typically communicatively coupled via one or more communications mechanisms 119, with the communications paths typically tailored to meet the needs of the application.

Various embodiments of component 110 may include more or less elements. The operation of component 110 is typically controlled by processing element 111 using memory 112 and storage devices 113 to perform one or more tasks or processes. Memory 112 is one type of computer-readable medium, and typically comprises random access memory (RAM), read only memory (ROM), flash memory, integrated circuits, and/or other memory components. Memory 112 typically stores computer-executable instructions to be executed by processing element 111 and/or data which is manipulated by processing element 111 for implementing functionality in accordance with an embodiment. Storage devices 113 are another type of computer-readable medium, and typically comprise solid state storage media, disk drives, diskettes, networked services, tape drives, and other storage devices. Storage devices 113 typically store computer-executable instructions to be executed by processing element 111 and/or data which is manipulated by processing element 111 for implementing functionality in accordance with an embodiment.

Figure 2:
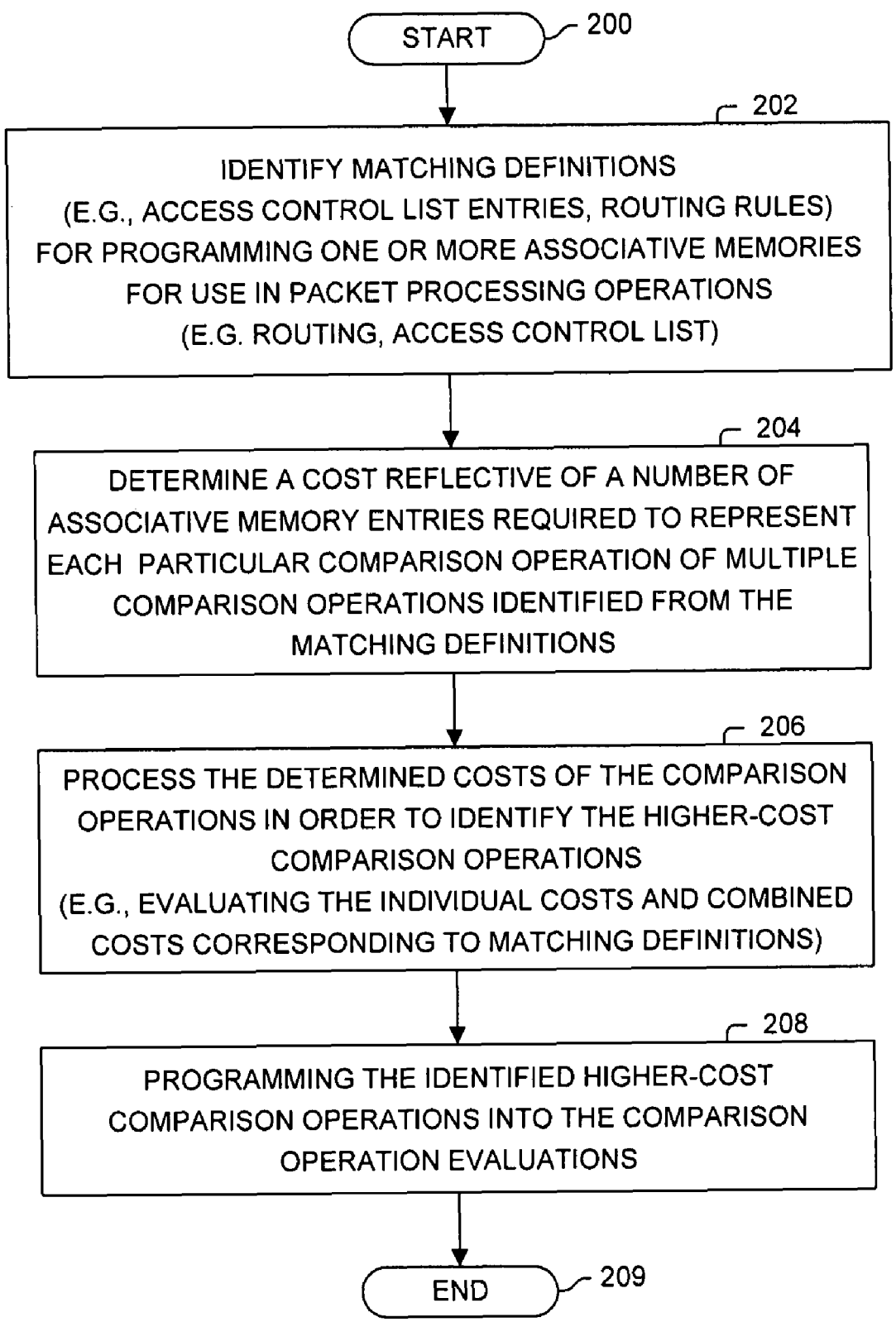
FIG. 2 illustrates a flow diagram of a process used in one embodiment.
Figure 3:
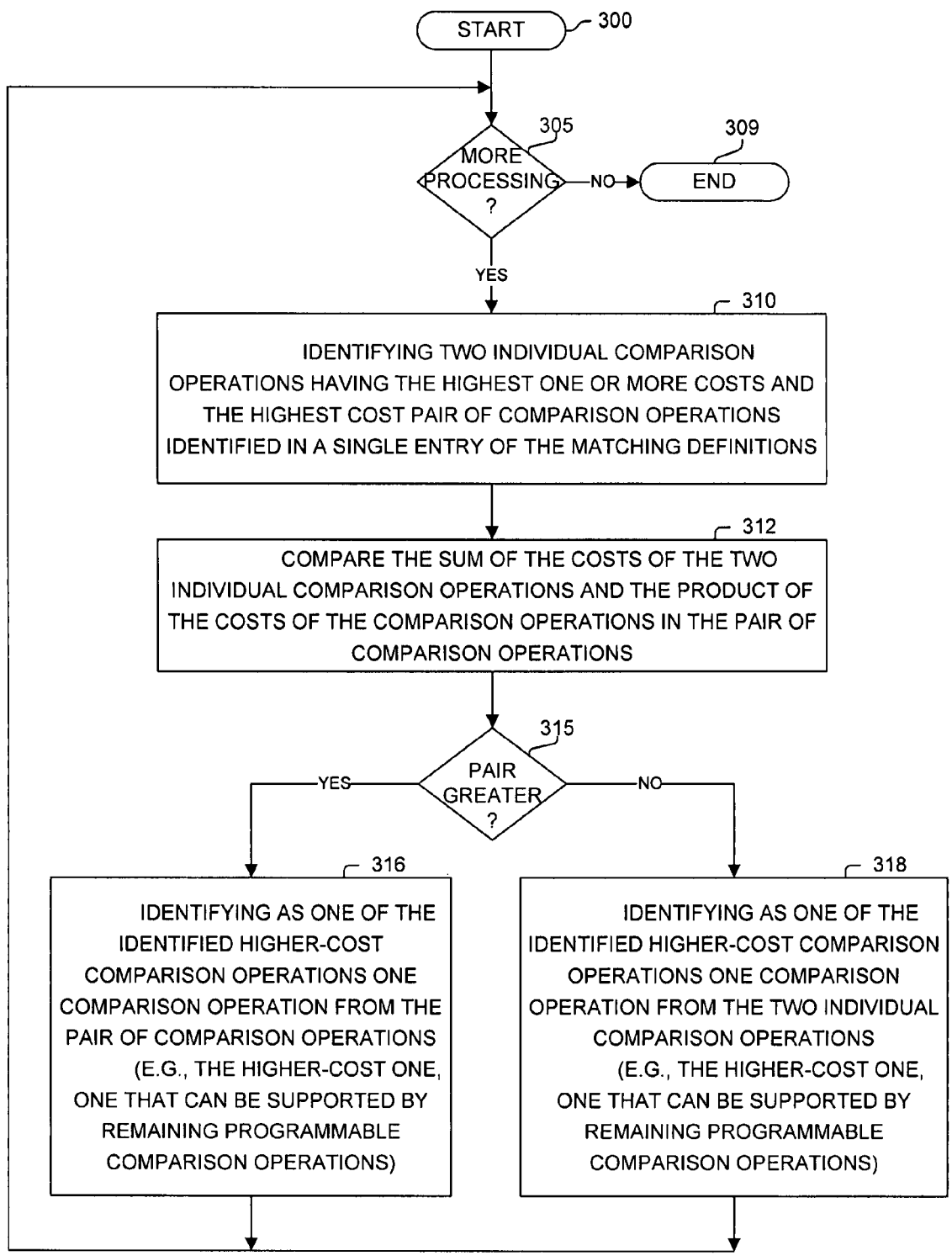
FIG. 3 illustrates a flow diagram of a process used in one embodiment.

Programming engine 110 is configured to determine the intelligent allocation of programmable comparison operations, such as by, but not limited to performing the operations described herein, such as in conjunction with FIGS. 2, 3, and/or 4. Programming engine 110 programs the programmable comparison operations in one or more comparison evaluators 120 with the determined higher-cost comparison operations for use by packet processor 130 in determining how to process (e.g., per ACL definitions, routing information, etc.).

In one embodiment, packet processor 130 receives a packet and extracts information typically from the packet header and/or other sources to identify a set of information to be used for a lookup operation. Based on its programming and the programming of comparison evaluator(s) 120, packet processor determines the information (comparison evaluator(s) input value 131, lookup word portion 132) on which to base a lookup operation. Comparison evaluator(s) 120 evaluate input value 131 against the programmed comparison operations to generate results 133, which are combined with lookup information 132 to generate a lookup word 134 (e.g., a search keyword). A lookup operation is performed on TCAM 135 based on lookup word 134 to identify a position 137 of a matching entry (if there is one), which is then used to perform a lookup operation in adjunct memory 138 to retrieve lookup result 138 (e.g., an ACL action or routing information for the corresponding packet) from a corresponding memory location. Packet processor processes the packet based on lookup result 139 and match/no match indication 136 (which identifies whether TCAM 135 found a matching entry).

FIG. 2 illustrates a flow diagram of a process for the intelligent allocation of programmable comparison operations used in one embodiment. Processing begins with process block 202, wherein the matching definitions (e.g., ACL entries, routing rules) are identified for programming the one or more associative memories, such as for use in packet processing operations. In process block 204, a cost reflective of a number of associative memory entries required to represent each particular comparison operation is determined.

In one embodiment, these comparison operations are determined after some processing to consolidate the comparisons operations. For example, an operation of less than seventy might be converted into a range of zero to sixty-nine; a not equal to 50 operation might be converted to two ranges of zero to forty-nine and fifty-one to the maximum value; a range of greater than 78 might be converted to an inclusive range of seventy-nine to the maximum value; two ranges of ten-twenty and ten-thirty, might be converted to the two ranges of ten to twenty and twenty-one to thirty, etc.

Expansion of operations (e.g., ranges, less than, greater than) can be achieved by binary expansion, which is the referred to cost of the operation. Because when an evaluator (e.g., programmable comparison operation of a comparison evaluator) is not available, the cost of a comparison operation is equal to (or some value based on) the number of associative memory entries (e.g., TCAM entries) that need to be programmed into the associative memory (e.g., TCAM) to perform the equivalent of the comparison operation.

In process block 206, the determined costs of the comparison operations are processed in order to identify the higher-cost comparison operations. In one embodiment, this processing includes evaluating the individual costs of comparison operations as well as the combined costs corresponding to an entry of the matching definitions.

In process block 208, the identified higher-cost comparison operations are programmed into the comparison evaluators.

Processing is complete as indicated by process block 209.

FIG. 3 illustrates a flow diagram of a process for the intelligent allocation of programmable comparison operations used in one embodiment. Processing begins with process block 300. As determined in process block 305, while there is more processing to be performed (e.g., there are more comparison operations to process and all comparison operation evaluators have not been allocated a comparison operation), then process blocks 310-318 are performed; else processing is complete as indicated by process block 309. Note, the processing in process blocks 310-318 describes processing of pairs of comparison operations, which can be directly extended to more than groups of two comparison operations in accordance with the scope and spirit of one embodiment.

In process block 310, two individual comparison operations having the highest one or more costs and the highest cost pair of the comparison operations identified in a single entry of the matching definitions are identified. In process block 312, the sum of the costs of the two individual comparison operations is compared to the product of the costs of the comparison operations in the pair of comparison operations. As determined in process block 315, if the pair is greater, then in process block 316, one of the comparison operations in the pair is identified as one of the higher-cost comparison operations to be programmed into a comparison operation evaluation; else in process block 318, one of the individual comparison operations is identified as one of the higher-cost comparison operations to be programmed into a comparison operation evaluation. Typically, the higher cost of the two comparison operations identified in process block 316 or 318 is identified as one of the higher-cost comparison operations to be programmed into a comparison operation evaluation. Also, in one embodiment, the comparison evaluators may not support all comparison operations, and in which case, the selection of the comparison operation is further based on the capabilities of the comparison operation evaluator(s) that have not been previously allocated a comparison operation.

FIG. 4 is a block diagram 400 illustrating pseudo code of a process used in one embodiment. Notes: this process processes the already determined costs of the comparison operations; this process assigns a value of zero to the cost of a comparison operation after it has been eliminated from further processing (e.g., it has been allocated or it cannot be allocated); and this process uses a list/array data structure for processing and allocating the comparison operations and their costs. The processing of the embodiment illustrated in FIG. 4, is similar to that described in relation to FIG. 3, and therefore, further explanation is unnecessary as one skilled in the art would understand the pseudo code of FIG. 4.

In view of the many possible embodiments to which the principles of our invention may be applied, it will be appreciated that the embodiments and aspects thereof described herein with respect to the drawings/figures are only illustrative and should not be taken as limiting the scope of the invention. For example, and as would be apparent to one skilled in the art, many of the process block operations can be re-ordered to be performed before, after, or substantially concurrent with other operations. Also, many different forms of data structures could be used in various embodiments. The invention as described herein contemplates all such embodiments as may come within the scope of the following claims and equivalents thereof.

What is claimed is:

1. A method for allocating a plurality of programmable comparison operations for use in packet processing operations in a packet switching device based on a plurality of matching definitions, the packet switching device comprising one or more comparison evaluators configured to evaluate an input value with one or more of the plurality of programmable comparison operations in order to generate and provide one or more values representing results of said evaluations to one or more associative memories for use in identifying said packet processing operations, the method comprising:

determining a cost reflective of a number of associative memory entries required to represent each particular comparison operation of a plurality of comparison operations, wherein the plurality of comparison operations are identified from the plurality of matching definitions;

processing said determined costs of the plurality of comparison operations in order to identify a plurality of higher-cost comparison operations of the plurality of comparison operations; and programming each of said identified higher-cost comparison operations into one of said programmable comparison operations of said comparison evaluators.

2. The method of claim 1, wherein said processing the determined costs includes evaluating said determined costs of (a) individual comparison operations of the plurality of comparison operations and (b) the combined cost of two or more comparison operations identified from single entries of the plurality of matching definitions.

3. The method of claim 2, wherein said evaluating said determined costs includes: (1) from a plurality of comparison operations not already identified as one of the plurality of higher-cost comparison operations, identifying (a) a plurality of individual comparison operations having the highest one or more costs and (b) a highest cost set of two or more comparison operations identified from a single entry of the plurality of matching definitions, and (2) identifying as one of said identified higher-cost comparison operations a selected comparison operation of said identified plurality of individual comparison operations having the highest one or more costs in response to determining that (a) the sum of the costs of said identified plurality of individual comparison operations having the highest one or more costs is greater than (b) the cost of said identified highest cost set of two or more comparison operations identified from a single entry of the plurality of matching definitions.

4. The method of claim 3, wherein the cost of the selected comparison operation is at least the cost of the other one or more comparison operations in the said identified plurality of individual comparison operations having the highest one or more costs.

5. The method of claim 2, wherein said evaluating said determined costs includes: (1) from a plurality of comparison operations not already identified as one of the plurality of higher-cost comparison operations, identifying (a) a plurality of individual comparison operations having the highest one or more costs and (b) a highest cost set of two or more comparison operations identified from a single entry of the plurality of matching definitions, and (2) identifying as one of said identified higher-cost comparison operations a selected comparison operation from said identified highest cost set of two or more comparison operations identified from a single entry of the plurality of matching definitions in response to determining that (a) the cost of said identified highest cost set of two or more comparison operations identified from a single entry of the plurality of matching definitions is greater than (b) the sum of the costs of said identified plurality of individual comparison operations having the highest one or more costs.

6. The method of claim 5, wherein the cost of the selected comparison operation is at least the cost of the other one or more comparison operations in the said identified highest cost set of two or more comparison operations identified from a single entry of the plurality of matching definitions.

7. The method of claim 2, wherein said evaluating said determined costs includes repeating a plurality of times, in order to identify said identified higher-cost comparison operations, a plurality of operations, said operations including: (1) identifying (a) two individual comparison operations having the highest one or more costs and (b) the highest cost pair of comparison operations identified from a single entry of the plurality of matching definitions, and (2) identifying as one of said identified higher-cost comparison operations one comparison operation from the group comprising: (a) said two individual comparison operations and (b) said pair of comparison operations, based a comparison of (i) the sum of the costs of said two individual comparison operations and (ii) the product of the costs of said comparison operations in the pair of comparison operations.

8. The method of claim 7, wherein said operation of identifying as one of said identified higher-cost comparison operations one comparison operation from said group is further based on the relative costs of said individual comparison operations or the relative costs of said comparison operations in the pair of comparison operations.

9. The method of claim 1, wherein the plurality of comparison operations has more comparison operations than the number of programmable comparison operations.

10. The method of claim 1, wherein said matching definitions are defined from an access control list.

11. The method of claim 1, wherein said matching definitions are defined from routing addresses.

12. The method of claim 1, wherein said one or more associative memories includes at least one ternary content-addressable memory (TCAM).

13. The method of claim 1, wherein said comparison operations include at least one range operation.

14. The method of claim 1, wherein said comparison operations includes at least one logical operation from a group of logical operations comprising greater than, greater than or equal to, less than, less than or equal to, equal to, and not equal to.

15. An apparatus comprising one or more processors and a memory, wherein the memory stores one or more instructions that, when executed by said one or more processors, perform operations for allocating a plurality of programmable comparison operations based on a plurality of matching definitions, said operations comprising:

determining a cost reflective of a number of associative memory entries required to represent each particular comparison operation of a plurality of comparison operations identified from the plurality of matching definitions; and processing said determined costs of said plurality of comparison operations in order to identify a plurality of higher-cost comparison operations of the plurality of comparison operations.

16. The apparatus of claim 15, wherein said apparatus includes: one or more comparison evaluators and one or more associative memories, wherein said one or more comparison evaluators are configured to evaluate an input value with one or more of the plurality of programmable comparison operations in order to generate and provide one or more values representing results of said evaluations to said one or more associative memories; and wherein said operations include programming said identified higher-cost comparison operations into the plurality of programmable comparison operations.

17. The apparatus of claim 16, wherein said processing the determined costs includes comparing: (a) the sum of said determined costs for two or more comparison operations of the plurality of comparison operations with (b) the combined said determined costs of two or more comparison operations identified from a single entry of the plurality of matching definitions, in order to determine whether to include in said higher-cost comparison operations a comparison operation from either (i) said two or more comparison operations of the plurality of comparison operations or (ii) said two or more comparison operations identified from a single entry of the plurality of matching definitions.

18. An apparatus configured to allocate a plurality of programmable comparison operations based on a plurality of matching definitions, the apparatus comprising:

means for determining a cost reflective of a number of associative memory entries required to represent each particular comparison operation of a plurality of comparison operations identified from the plurality of matching definitions; and means for processing said determined costs of said plurality of comparison operations in order to identify a plurality of higher-cost comparison operations of the plurality of comparison operations;

wherein each of said means for determining and said means processing includes a processing element.

19. The apparatus of claim 18, wherein said apparatus includes: means for performing said programmed comparison operations, means for programming said means for performing said programmed comparison operation, and one or more associative memories; wherein said means for performing said programmed comparison operation are configured to evaluate an input value with one or more of the plurality of programmable comparison operations in order to generate and provide one or more values representing results of said evaluations to said one or more associative memories.

20. The apparatus of claim 19, wherein said means for said processing the determined costs includes: means for comparing: (a) the sum of said determined costs for two or more comparison operations of the plurality of comparison operations with (b) the combined said determined costs of two or more comparison operations identified from a single entry of the plurality of matching definitions, in order to determine whether to include in said higher-cost comparison operations a comparison operation from either (i) said two or more comparison operations of the plurality of comparison operations or (ii) said two or more comparison operations identified from a single entry of the plurality of matching definitions.

* * * * *

UNITED STATES PATENT AND TRADEMARK OFFICE
CERTIFICATE OF CORRECTION

| | |
|---|---|
| PATENT NO. | : 7,788,445 B2 |
| APPLICATION NO. | : 11/729367 |
| DATED | : August 31, 2010 |
| INVENTOR(S) | : Pani |

It is certified that error appears in the above-identified patent and that said Letters Patent is hereby corrected as shown below:

Col. 12, Claim 18, line 39, replace "means processing" with -- means for processing --

Signed and Sealed this

Second Day of November, 2010

David J. Kappos
*Director of the United States Patent and Trademark Office*